United States Patent
Wohlfarth et al.

(10) Patent No.: US 6,191,595 B1
(45) Date of Patent: Feb. 20, 2001

(54) ADHESIVE ATTACHING, THERMAL RELEASING FLAT PACK PROBE ASSEMBLY

(75) Inventors: Paul D. Wohlfarth, Vernonia; Douglas R. Malech, Portland, both of OR (US)

(73) Assignee: Credence Systems Corporation, Fremont, CA (US)

( * ) Notice: Under 35 U.S.C. 154(b), the term of this patent shall be extended for 0 days.

(21) Appl. No.: 09/364,682

(22) Filed: Jul. 30, 1999

(51) Int. Cl.$^7$ .................................................. G01R 31/02
(52) U.S. Cl. ........................ 324/754; 324/72.5; 324/758
(58) Field of Search .................................. 324/754, 72.5, 324/757, 758, 761, 765, 755; 248/205.3, 205.4, 467, 683

(56) References Cited

U.S. PATENT DOCUMENTS

| | | | |
|---|---|---|---|
| 4,055,800 | 10/1977 | Fisk et al. | 324/754 |
| 4,112,363 | * 9/1978 | Morrison et al. | 324/758 |
| 4,362,991 | 12/1982 | Carbine | 324/754 |
| 4,767,985 | 8/1988 | Shearer, Jr. et al. | 324/754 |
| 4,845,427 | * 7/1989 | Hultin | 324/72.5 |
| 5,033,977 | * 7/1991 | Ignasiak | 324/754 |

* cited by examiner

*Primary Examiner*—Ernest Karlsen
(74) *Attorney, Agent, or Firm*—Daniel J. Bedell; Smith-Hill and Bedell

(57) ABSTRACT

A probe assembly contacts pins of a flat pack or other integrated circuit (IC) package having a body with a flat upper surface and a plurality of pins extending horizontally outward from the IC package body. The probe assembly includes a base that is bonded to the upper surface of the IC package body by a thermal-releasing adhesive when the base is pressed onto the IC package body. A set of probes (spring pins) extending downward from the base contact the IC pins when the base is bonded to the IC package body. The base includes a heating element for supplying heat to warm the adhesive and weaken the adhesive bond when the probe assembly is to be removed from the IC package. The heating element generates the heat in response to a current pulse passing through the heating element or alternatively receives the heat from an external source and conducts it to the adhesive. The probe assembly also provides a base for mounting intelligent interface circuits that facilitate testing of the IC being probed and reduce the required number of connections between the probe assembly and external test equipment.

22 Claims, 4 Drawing Sheets

ADHESIVE ATTACHING, THERMAL RELEASING FLAT PACK PROBE ASSEMBLY

CROSS-REFERENCE TO RELATED APPLICATION

Figure 1:
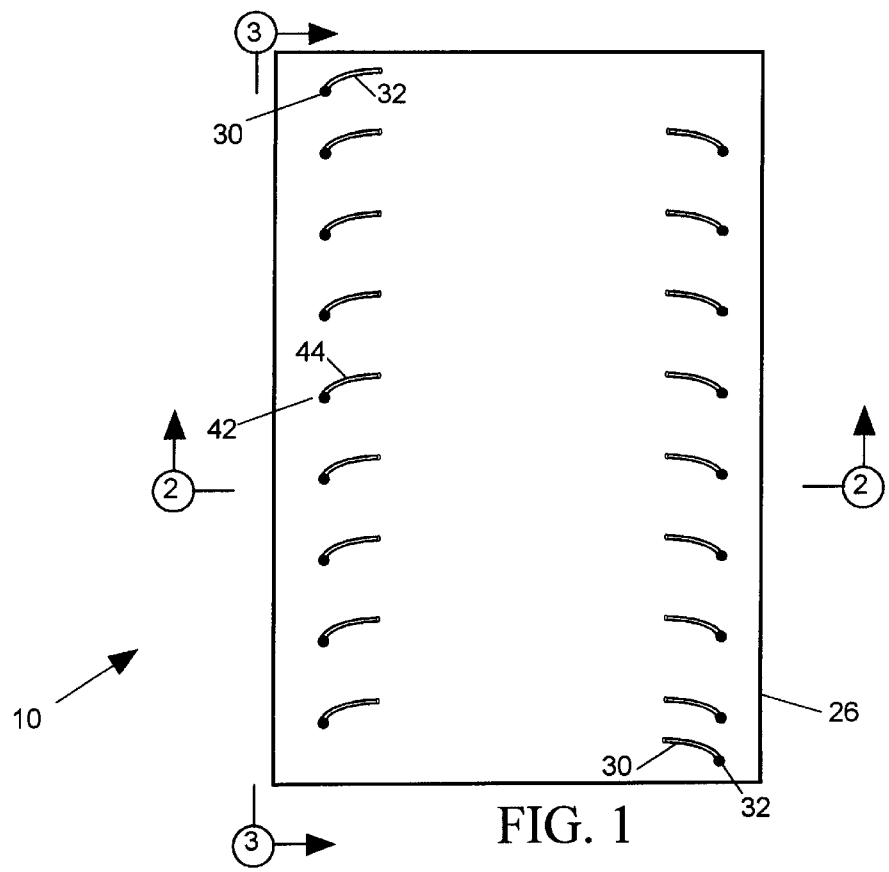

The present application contains subject matter related to the subject matter of U.S. patent application Ser. No. 09/364,683 filed concurrently herewith.

BACKGROUND OF THE INVENTION

1. Field of the Invention

The present invention relates in general to integrated circuit (IC) probes and in particular to a probe that attaches to a flat pack IC package via a thermal-releasing adhesive and which includes a heating element for weakening a bond provided by the adhesive.

2. Description of Related Art

When testing a circuit implemented by integrated circuits (ICs) mounted on a circuit board, a technician can access a circuit node by manually holding a probe to a pin of an IC. However it is difficult for a technician to concurrently access more than one or two IC pins using this method. It is also often difficult to access pins of an IC mounted on a circuit board when the circuit board is in its operating environment. For example when the circuit board is installed in a backplane next to another circuit board there is very little clearance between the circuit boards for accommodating a probe. Thus it would be beneficial to provide a probe that can be firmly attached to an IC mounted on a circuit board, that would remain attached when the circuit board is thereafter installed in its operating environment, and which has a low profile so that it requires very little space above the IC.

Probes have been developed which clamp to IC pins. For example U.S. Pat. No. 4,767,985 issued Aug. 30, 1988 to Shearer, Jr. et al describes a probe that clamps to the corner pins of an IC package. Such a probe is suitable for packages having pins with portions that can be easily gripped by a probe. However flat pack IC packages have pins that are soldered flush with the circuit board and would be difficult for such a probe to firmly grip. Also the described probe assembly is relatively tall and would not be useful where space above the IC is limited.

U.S. Pat. No. 4,362,991 issued Dec. 7, 1982 to Carbine describes a probe assembly for circuit board mounted flat pack IC packages that employs an external frame to hold a probe onto flat pack pins by pressure. However the assembly is large and inconvenient to use insofar as the circuit board has to be mounted within the probe assembly rather than installed in its normal operating environment.

U.S. Pat. No. 4,055,800 issued Oct. 25, 1977 to Fisk et al. describes a probe that clamps to the body of an IC rather than to its pins. While this type of probe can grasp relatively thick integrated circuit packages, a flat pack package is typically so thin that it would be difficult for such a probe to firmly grip its body. Also since the probe is held to an IC package body only by lateral pressure, it can easily fall off. This probe assembly is also relatively tall and therefore not practical where space above the IC is limited.

What is needed is a means for easily and firmly holding a set of probes onto pins of a flat pack or other type of integrated circuit package when mounted on a circuit board and which has a relatively low profile so that it does not require substantial space above the circuit board.

It would also be desirable to provide a low-profile probe assembly that can access a large number of IC pins. However such a probe assembly would require a large number of conductors to convey signals between the probe assembly and external test equipment requiring access to the IC pins. It would therefore also be helpful if the probe assembly itself could carry out some of the functions of the external test equipment so as to reduce the number of connections between the probe assembly and the external test equipment.

It would be of further benefit for a probe assembly to provide a relatively short signal path between an IC pin and a high impedance buffer amplifier. Prior art probes typically include high-impedance buffer amplifiers in the signal path between an IC pin and test equipment accessing the pin in order to reduce the load the probe presents at the pin. However, since prior art probe assemblies provide a relatively long signal path between an IC pin and buffer amplifier, the capacitance and inductance of those signal paths act as a load on the IC pin. By providing a very short path between buffer amplifiers and the IC pins, an improved probe assembly would reduce the load on the IC pins.

SUMMARY OF THE INVENTION

A probe assembly in accordance with the invention provides signal paths between test equipment and pins of a flat pack or other integrated circuit (IC) package of the type having a body with a flat upper surface and a set of pins extending horizontally outward from the IC package body. In accordance with one aspect of the invention, the probe assembly includes a base and an adhesive for bonding the base to the IC package body when they are pressed together. When the base is bonded to the upper surface of the IC package body, a set of conductive probes (suitably spring pins) attached to the base contact the IC pins.

In accordance with another aspect of the invention, the probe assembly also includes a set of guide fingers formed of resilient insulating material extending downward from the base. The guide fingers fit between separate pairs of the IC pins when the base is bonded to the IC package body and act as guides for positioning the probe base on the IC as they are pressed together.

In accordance with a further aspect of the invention, the adhesive is a thermal-releasing adhesive which, when sufficiently cool, firmly bonds the base to the IC package body when the base is pressed onto the IC package body. The base includes a heating element for selectively supplying heat to the adhesive when the probe assembly is to be removed from the IC package. The heat weakens the adhesive bond between the probe base and the IC package body, thereby allowing the probe assembly to be easily lifted from the IC. The heating element suitably comprises material that generates substantial heat when conducting current. Thus the probe assembly can be removed from the IC by supplying a current pulse through the heating element. Alternatively the heating element comprises a heat conductor such as copper for conducting heat from an external heat source (such as for example a soldering iron) to the adhesive.

In accordance with another aspect of the invention, the probe assembly base includes a printed circuit board upon which are mounted high-impedance amplifiers for buffering signals passing between the IC pins and external test equipment accessing those pins. Since the signal paths between the pins and the buffer amplifiers are short, the probe assembly presents very little load on the IC pins. An intelligent interface circuit may also be installed on the printed circuit board for carrying out test activities on the IC and for reducing the number of connections needed between the probe assembly and the external test equipment.

Thus the probe assembly is easily and firmly bonded with the adhesive to an IC when the probe base is sufficiently cool simply by pressing the probe base onto the IC using the guide fingers as positioning guides. The probe assembly can thereafter be easily removed from the IC by applying heat to the adhesive via the heating element to weaken the bond. Since the probe assembly consists of only a few relatively thin layers of material, it has a relatively low profile, occupies relatively little space above a circuit board, and provides a very short signal path to the IC pins.

It is accordingly an object of the invention to provide a probe assembly that is easily and firmly attached to a flat pack or other type of integrated circuit package and easily removed, that occupies little vertical space above the IC package, that provides a short signal path to buffer amplifier, and that minimizes the number of signal paths needed between the probe assembly and external test equipment.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 2:
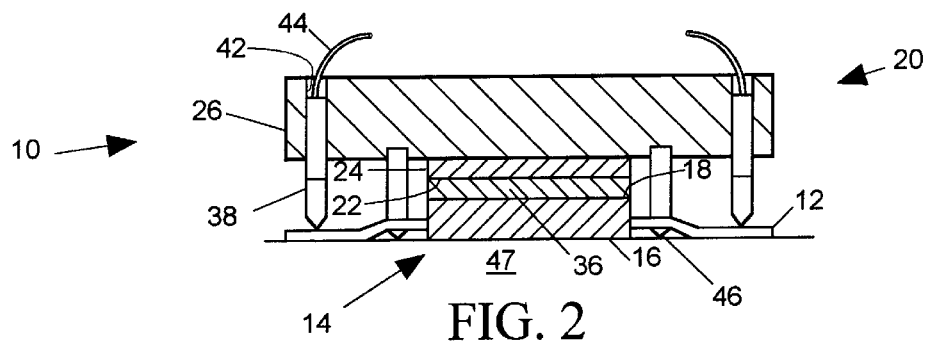
Figure 3:
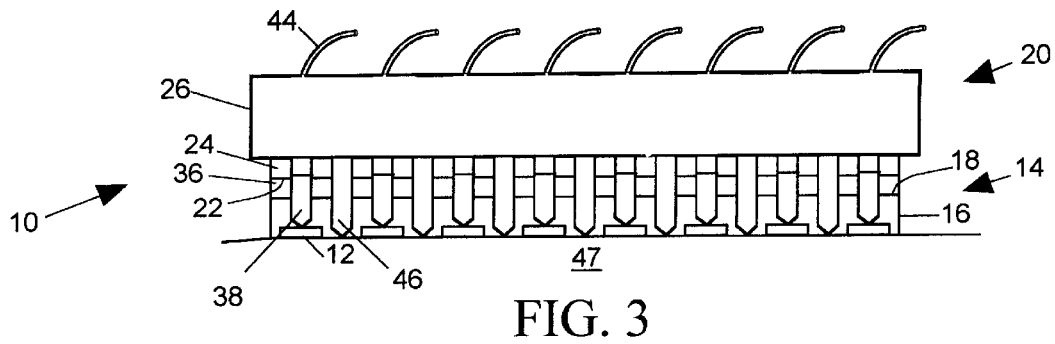
Figure 4:
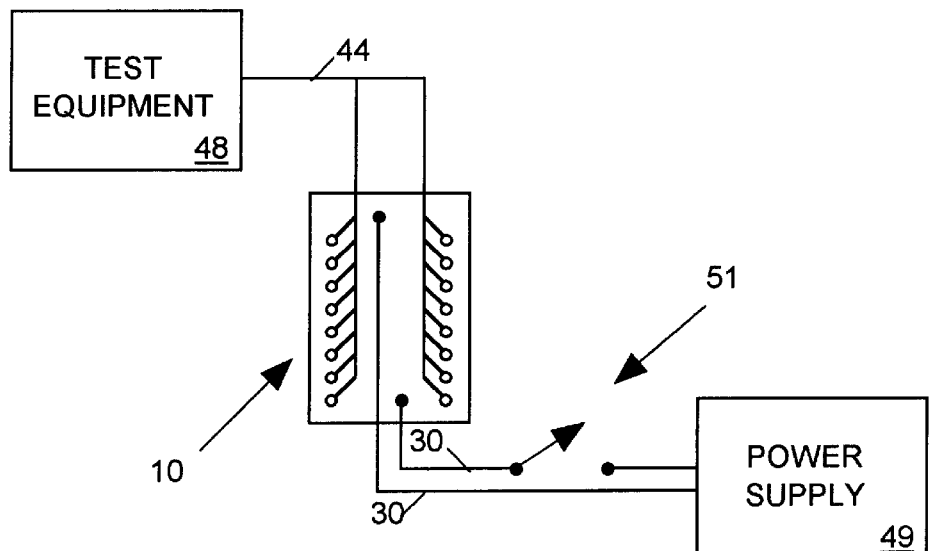
Figure 5:
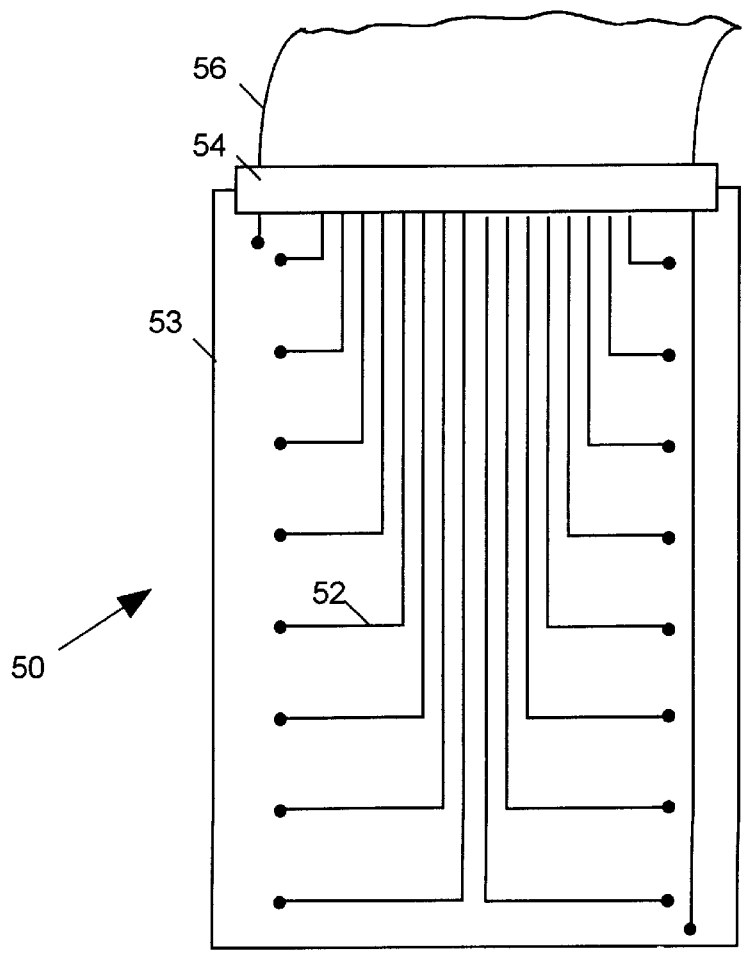
Figure 6:
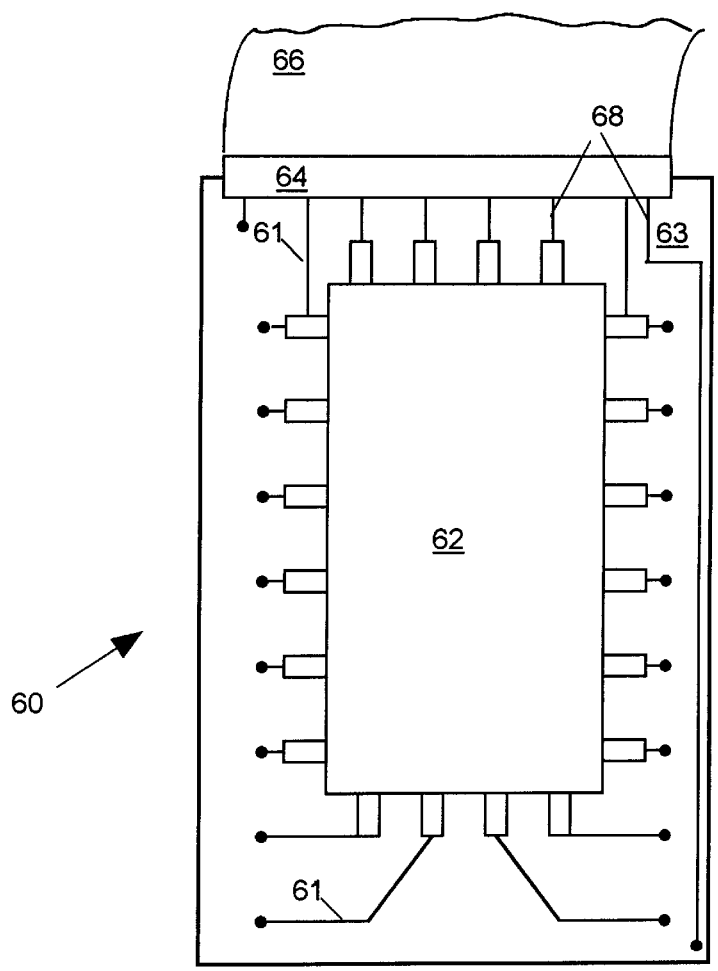
Figure 7:
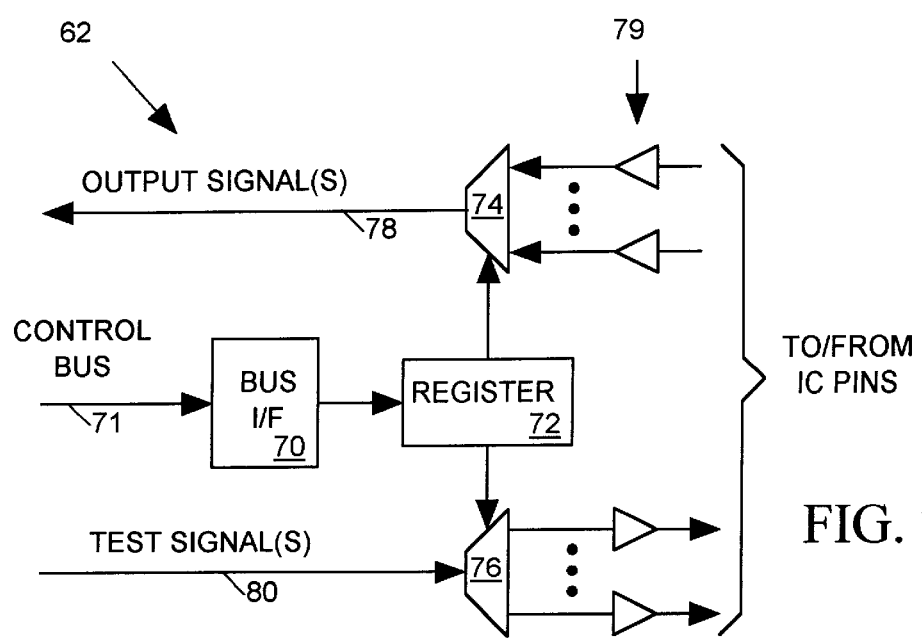
Figure 8:
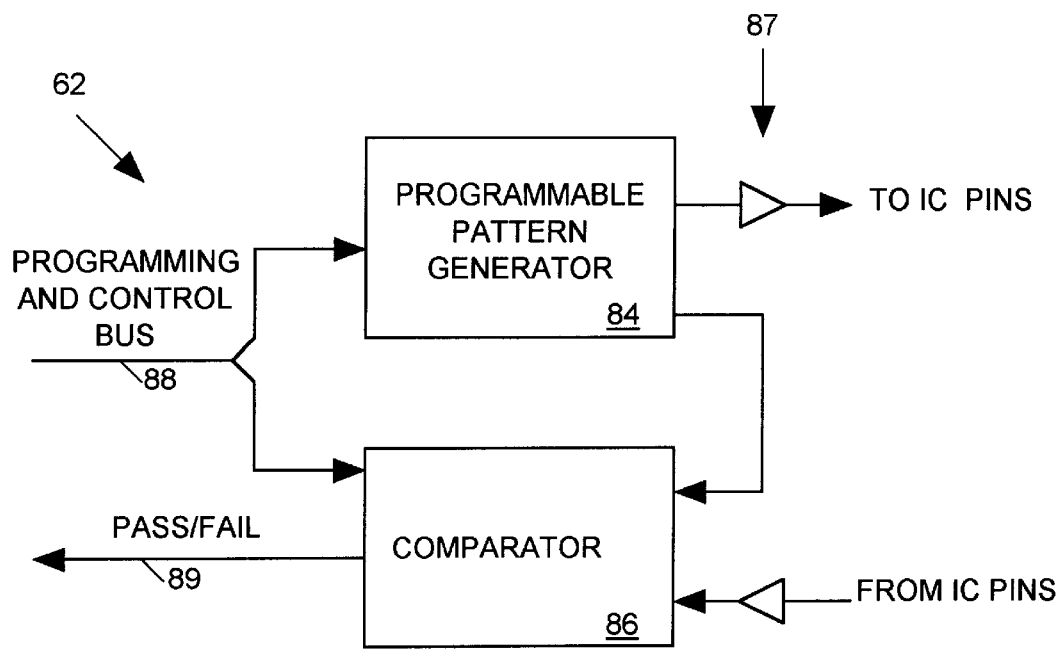
Figure 9:
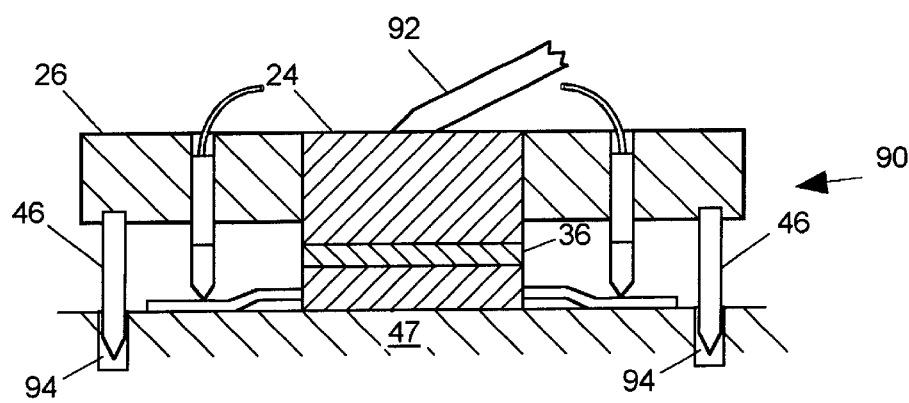

FIG. 1 is a plan view of a probe assembly in accordance with the present invention, FIG. 2 is a sectional elevation view of the probe assembly of FIG. 1, FIG. 3 is a side elevation view of the probe assembly of FIG. 1, FIG. 4 is an electrical block diagram of the probe assembly of FIG. 1, FIGS. 5 and 6 are plan views of alternative embodiments of a probe assembly in accordance with the present invention, FIG. 7 is a block diagram of circuits implemented by the integrated circuit included in the probe assembly of FIG. 6, and FIGS. 8 and 9 are sectional elevation views of another embodiment of a probe assembly in accordance with the invention.

DESCRIPTION OF THE PREFERRED EMBODIMENT(S)

FIGS. 1–3 illustrate a probe assembly 10 in accordance with the invention for providing external test equipment with access to input/output signal pins of an integrated circuit (IC) package 14. Integrated circuit package 14 may be a conventional flat pack package as illustrated in FIGS. 1–3 or may be any other type of IC package (such as for example a quad flat pack or an in-line package) including a body 16 having a flat upper surface 18 and a set of input/output pins 12 extending horizontally outward from body 16.

Probe assembly 10 includes a base 20 suitably including a conventional circuit board 26 or other rigid insulator and a heating element 24 attached to the underside of the circuit board. Heating layer 24 is suitably made of copper nichrome, brass or other high resistance metals or of any other conductive material that generates substantial heat when conducting a current. Vias 30 through circuit board 26 connect a pair of power leads 32 to heating element 24 so that an external power supply can selectively apply a voltage across opposing ends of heating element 24. The applied voltage produces a current through heating element 24 and causing it to warm up thereby releasing the adhesive bond between the probe assembly and the IC.

Probe assembly 10 also includes an adhesive 36 for creating a bond between a lower surface 22 of heating element 24 and the upper surface 18 of IC package body 16 when base 20 is pressed onto body 16. Adhesive 36 is a "thermal-releasing" adhesive in that while the bond it provides is strong when adhesive 36 is sufficiently cool, the bond grows weak when the adhesive becomes sufficiently warm. Many well-known pressure-setting or catalyst adhesives are thermal-releasing and could be employed as adhesive 36. For example adhesive 36 can be a combination of Locktite (brand) model 444 adhesive deposited on lower surface 22 of base 20 and Locktite (brand) model 7452 accelerator catalyst deposited on upper surface 18 of package body 16. The two components quickly provide a strong bond when pressed together at temperatures not exceeding typical IC operating temperatures, but sufficiently high temperatures substantially weaken that bond.

When an external power supply connected to power leads 32 supplies a voltage pulse of sufficient duration across opposite ends of heating element 24, a current pulse produced in heating element 24 causes it to supply enough heat to substantially weaken the adhesive bond holding base 20 to IC 14. Probe base 20 can then be easily lifted off IC package body 16.

Probe assembly 10 also incudes a set of conductive probes 38 attached to base 20, each for contacting a separate one of pins 12 when base 20 is bonded to IC package body 16. Each probe 38 suitably includes a conventional spring pin (also known as a "pogo pin") fixed within a hole 42 in base 20 and extending downward from base 20 to contact a corresponding IC pin 12. Separate leads 44 soldered to each probe 38 provide signal paths to external test equipment.

A set of guide fingers 46 formed of insulating material attached to base 20 with each guide finger extending downward from base 20 and fitting between a separate pair of adjacent IC pins 12. Guide fingers 46 extend somewhat lower than probes 38 so that they properly position probes 38 over pins 12 as base 20 is pressed onto IC package body 16. Guide fingers 46 are suitably made of resilient material such as plastic so that they can be compressed against the upper surface of the circuit board 47 upon which IC 14 is mounted without damaging it.

Thus probe assembly 10 may be attached to IC 14 simply by aligning guide fingers 46 between pins 12 and pressing base 20 onto IC 14. When no voltage is applied across heating element 24, the thermal-releasing adhesive 36 remains sufficiently cool to tightly bond base 20 to IC 14, thereby holding probes 38 firmly on pins 12. Probe assembly 10 may thereafter be removed from IC 14 by applying a voltage pulse across leads 32 to produce a current through heating element 24 sufficient to cause heating element 24 to generate enough heat to warm adhesive 36, weakening its bond and allowing probe assembly 10 to be easily lifted off IC 14.

FIG. 4 is an electrical block diagram illustrating test signal leads 44 of the probe assembly 10 of FIG. 1 connected to test equipment 48 and power leads 30 connected to a power supply 49 through a switch 51. When switch 51 is closed, power supply 49 supplies a current through heating element 24 of FIGS. 2 and 3. Switch 51 is open while probe assembly 10 is to remain attached to an IC and closed when probe assembly 10 is to be removed from the IC.

FIG. 5 illustrates an alternative embodiment of the invention, a probe assembly 50 generally similar to probe 10 of FIG. 1 except that leads 44 of probe 10 are replaced with traces 52 on the upper surface of the circuit board 53 forming the top of the probe assembly. Traces 52 lead to a connector 54 for an external cable 56 leading to the external test equipment and heating current power supply.

FIG. 6 illustrates another embodiment of the invention, a probe assembly 60 generally similar to probe assembly 10 of FIG. 1 but in which leads 44 of probe 10 are replaced with traces 61 leading to pins of an integrated circuit 62 mounted on circuit board 63 forming the top layer of probe assembly 60. A connector 64 for an external ribbon cable 66 leading to external test equipment and an external power supply is also installed on circuit board 63. Traces 68 link connector 64 to other pins of integrated circuit 62 and to vias 70 leading to the heating element within probe assembly 60. The integrated circuit 62 mounted circuit board 63 suitably provides a high-impedance buffer between the IC being probed and the external test equipment.

Since the signal paths between buffers in IC 62 and pins 12 of the IC 14 being probed are very short, the signals have little capacitance and inductance. Thus probe assembly 60 places little load on the IC pins 12. In addition to providing high-impedance buffers, integrated circuit 62 may also include circuits providing an intelligent interface between the IC pins and external test equipment. Examples of such interface circuits are described below.

FIG. 7 is a block diagram illustrating an embodiment of IC 62 including a conventional bus interface 70 allowing external test equipment use a serial control bus 71 (included in ribbon cable 66, FIG. 6) to write data to a register 72 controlling a pair of multiplexers 74 and 76. Multiplexer 74 selects one (or more) signal outputs of the IC being probed to be delivered to the test equipment via a line 78 on ribbon cable 66. Multiplexer 76 applies a test signal (or signals) 80 arriving by ribbon cable line 80 to one (or more) selected pins of the IC being probed. Thus IC 62 of FIG. 7 reduces the amount of cabling needed to link the probe assembly to test equipment not requiring concurrent access to all pins of the IC being probed. High impedance amplifiers 79 buffer IC pin input and output signals.

FIG. 8 is a block diagram illustrating another embodiment of IC 62 wherein IC 62 carries out logic test functions. In this embodiment IC 62 implements a conventional programmable pattern generator 84 and a conventional comparator 86. Pattern generator 84 supplies one data pattern as input signals to various pins of the IC being probed and another data pattern to comparator 86. Comparator 86 compares an output signal pattern appearing at other pins of the IC being probed to determine whether the IC is behaving as expected. A programming and control bus 88 from external test equipment programs the patterns into pattern generator 84 and controls timing of its pattern generation as well as the timing of comparisons made by comparator 86. Comparator 86 sends a pass/fail signal 89 back to the external test equipment to indicate when the IC being probed has failed to produce an expected output data pattern. High impedance amplifiers 87 buffer IC pin input and output signals.

FIG. 9 illustrates a probe assembly 90 in accordance with an alternative embodiment of the invention that is generally similar to probe assembly 10 of FIGS. 1–3. However in probe assembly 90 heating element 24 extends upward through circuit board 26 so that it can receive heat from an external heat source such as for example the tip 92 of a soldering gun or other suitable heat source. In this embodiment heating element 24 is a passive heating element that does not generate heat in response to an applied voltage but simply conducts heat from the external source to the thermal-releasing adhesive 36. Heating element 24 of probe assembly 90 is suitably made of copper or other highly thermal conductive material.

In probe assembly 90, circuit board 26 extends horizontally beyond IC 12 and the guide fingers 46 attached to circuit board 26 extend downward into holes 94 in the circuit board 47 upon which the IC 14 under test is mounted. This guide finger arrangement can alternatively be used in the probe assembly of FIGS. 2, 5 or 6 when the pitch between adjacent IC pins is too small to receive a guide finger.

Thus has been described a probe assembly that may be easily and firmly bonded with adhesive to an IC simply by pressing the probe base onto the IC using guide fingers as positioning guides. The probe assembly can thereafter be easily removed from the IC by applying heat to the adhesive via its internal heating element to weaken the bond. Since the probe assembly has a relatively low profile can be used in working environments providing relatively little clearance above the IC being probed. The probe assembly also provides a base for mounting intelligent interface circuits that facilitate testing of the IC being probed and reduce the required number of connections between the probe assembly and external test equipment.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A probe assembly for providing a signal path to a pin of an integrated circuit (IC) package including a body having a horizontal upper surface and having pins extending horizontally outward from said body, the probe assembly comprising:
   a base including a heating element;
   an adhesive creating a bond between said horizontal upper surface of said base and said IC package body, wherein said bond substantially weakens as said adhesive is sufficiently warmed, wherein said heating element delivers sufficient heat to warm said adhesive thereby substantially weakening said bond; and
   a conductive probe attached to and extending below said base and contacting one of said pins for providing said signal path.

2. The probe assembly in accordance with claim 1 further comprising means for transmitting a current pulse through said heating element, wherein said heating element generates said heat in response to said current pulse.

3. The probe assembly in accordance with claim 1 wherein said probe comprises a spring pin.

4. The probe assembly in accordance with claim 1 further comprising means for generating and supplying said heat to said heating element, wherein said heating element conducts said heat to said adhesive.

5. The probe assembly in accordance with claim 4 wherein said base comprises a circuit board having a horizontal surface, wherein said heating element extends vertically through said circuit board.

6. The probe assembly in accordance with claim 1 further comprising a guide finger attached to said base, said extending downward from said base and fitting between a pair of said pins.

7. The probe assembly in accordance with claim 6 wherein said guide finger comprises resilient material.

8. The probe assembly in accordance with claim 1 wherein said integrated circuit package is mounted on a circuit board containing a set of holes adjacent to said integrated circuit package and wherein said probe assembly further comprises a plurality of guide fingers attached to said base and extending into said holes.

9. The probe assembly in accordance with claim 1 wherein said base further comprises a circuit board forming an upper surface of said base, said heating element being positioned between said circuit board and said adhesive.

10. The probe assembly in accordance with claim 9 further comprising means for transmitting a current pulse through said heating element, wherein said heating element generates said heat in response to said current pulse.

11. The probe assembly in accordance with claim 9 wherein said base further comprises:
   a cable connector,
   a conductive trace formed on said circuit board and conductively linked to said cable connector, and
   means for conductively linking said conductive trace to said conductive probe.

12. A probe assembly for contacting pins of an integrated circuit (IC) package having a body and having a plurality of pins extending horizontally outward from said body, the probe assembly comprising:
   a circuit board;
   a heating element attached to said circuit board for generating substantial heat when conducing a current;
   an adhesive providing a bond between said heating element and said IC package body, wherein said bond substantially weakens as said adhesive is warmed;
   a conductive probe attached to said circuit board for contacting one of said pins of said IC package; and
   means for selectively supplying said current to said heating element such that said heating element generates said substantial heat thereby warming said adhesive and causing it to substantially weaken said bond.

13. The probe assembly in accordance with claim 12 wherein said probe comprises a spring pin.

14. The probe assembly in accordance with claim 12 further comprising a guide finger attached to and extending downward from said circuit board and fitting between a pair of said input/output pins.

15. The probe assembly in accordance with claim 12 said guide finger is formed of resilient insulating material.

16. The probe assembly in accordance with claim 11 further comprising:
   an amplifier mounted on said circuit board, and
   means for conductively linking said amplifier to said probe.

17. A probe assembly for contacting pins of an integrated circuit (IC) package having a body with a flat upper surface and having a plurality of input/output pins extending horizontally outward from said body, the probe assembly comprising:
   a base including a conductive heating element for generating substantial heat when conducing a current;
   a thermal-releasing adhesive creating a bond between said base and said IC package body, wherein said bond weakens as said adhesive warms; and
   a plurality of spring pin probes attached to said base for contacting said input/output pins of said IC package when said adhesive bonds said base to said IC package body.

18. The probe assembly in accordance with claim 17 further comprising means for selectively supplying said current to said heating element such that said heating element generates said substantial heat thereby warming said adhesive sufficient to substantially weaken said bond.

19. An apparatus for testing a first integrated circuit (IC) having a body and pins extending horizontally outward from said body, the apparatus comprising:
   a base including a heating element;
   a second integrated circuit mounted on said base;
   an adhesive creating a bond between said base and said IC package body, wherein said bond substantially weakens when said adhesive is sufficiently warmed, wherein said heating element delivers sufficient heat to warm said adhesive thereby substantially weakening said bond;
   a plurality of probes attached to said base, each probe contacting a corresponding one of said pins; and
   a plurality of conductors, each linking a corresponding one of said probes to said second integrated circuit.

20. The apparatus in accordance with claim 19 wherein said second integrated circuit device receives and amplifies output signals produced by said first integrated circuit.

21. The apparatus in accordance with claim 19 further comprising means for transmitting a current pulse through said heating element, wherein said heating element generates said heat in response to said current pulse.

22. The apparatus in accordance with claim 19 wherein said probes comprise spring pins.

* * * * *